United States Patent [19]

Yeung

[11] Patent Number: 5,706,004
[45] Date of Patent: Jan. 6, 1998

[54] SYSTEM FOR REDUCING NOISE COUPLING BETWEEN DIGITAL AND ANALOG CIRCUITRY

[75] Inventor: Michael K. Yeung, Fremont, Calif.

[73] Assignee: Phylon Communications, Inc., Fremont, Calif.

[21] Appl. No.: 529,928

[22] Filed: Sep. 18, 1995

[51] Int. Cl.$^6$ .................................................. H03M 1/00
[52] U.S. Cl. .................................................. 341/122
[58] Field of Search ....................................... 341/122

[56] References Cited

U.S. PATENT DOCUMENTS

| | | | |
|---|---|---|---|
| 4,746,899 | 5/1988 | Swanson et al. | 340/347 AD |
| 5,307,066 | 4/1994 | Kobayashi et al. | 341/155 |
| 5,373,293 | 12/1994 | Hirata | 341/118 |
| 5,422,807 | 6/1995 | Mitra et al. | 341/142 |
| 5,479,168 | 12/1995 | Johnson et al. | 341/110 |

FOREIGN PATENT DOCUMENTS 5-143187  6/1993  Japan .

*Primary Examiner*—Jeffrey A. Gaffin
*Assistant Examiner*—Thuy-Trans N. Huynh
*Attorney, Agent, or Firm*—Townsend and Townsend and Crew LLP

[57] ABSTRACT

A system for reducing noise coupling in a mixed-signal IC includes a digital clock, an analog clock, and gating signal generator, and a gating circuit. The gating circuit receives a digital clock signal and the gating pulse to generate a gated digital clock signal having no pulses at a sampling edge of the analog clock signal to provide a "quiet time" for analog sampling.

2 Claims, 4 Drawing Sheets

SYSTEM FOR REDUCING NOISE COUPLING BETWEEN DIGITAL AND ANALOG CIRCUITRY

BACKGROUND OF THE INVENTION

1. Field of the Invention

The present invention relates generally to mixed-signal ICs having analog and digital circuitry combined on a single monolithic substrate and, more particularly, relates to methods of preventing the coupling of noise between the analog and digital portions of the IC.

2. Description of the Relevant Art

Advances in fabrication technology have enabled entire functional blocks, which previously had been implemented as plural chips on a circuit board, to be integrated onto a single IC. One particularly significant development is mixed-signal circuits which combine analog circuitry and digital logic circuitry onto a single IC. However, a major technical hurdle to implementing mixed-signal circuits has been the coupling of noise from the digital to the analog portions of the IC.

One of the more significant contributors to noise in a mixed-signal sampled-data circuit is the coupling through the power supply of the noise generated by the switching transients of the logic gates. This noise, when sampled by the sample and hold functions that are part of any analog sampled data functions, such as switched capacitor filters, D/A converters, A/D converters, or comparators, may be aliased into lower frequencies that contribute to the noise of a circuit at undesirable frequencies.

Previous solutions have involved delaying clock edges with respect to each other, one clock edge defining the analog sampling time points and the other defining the logic circuit state changes for synchronous logic. As the digital clock frequencies rise to higher and higher frequencies there will be logic switching noise along more and more of the period between clocks, so the "quiet period" may be unavailable or too short to allow noise-free analog sampling.

For example, the noise coupling reduction techniques disclosed in U.S. Pat. No. 4,746,899 uses separate clocks for the analog and digital circuitry to reduce the interaction between the two sections. The analog clock could be delayed with respect to the digital clock, or the digital clock delayed to the analog clock, so that the logic noise would not occur during the analog sampling points. However, as the digital clock frequencies rise higher and higher, as in an application where a digital processing unit such as a CPU or DSP is combined with analog circuitry, there may be very little time during a digital clock cycle where all the digital circuitry has arrived at the final state and the supply and substrate are quiet. Also, many analog circuit functions will be excited by the logic noise and will have settling or recovery times longer than a digital clock cycle. This means that some voltages may always be noisy, and cannot be sampled without noise.

Thus, as depicted in FIG. 4, a logic noise signal 330 includes noise transients 332, generated for each timing pulse in a digital clock 300, with the noise transients 332 having a duration determined by the recovery times of the analog circuits from excitation due to digital transients and other factors. The sampling edge 306 of an analog clock is positioned between pulses of the digital clock signal. However, as the frequency of the digital clock signal increases the time between pulses becomes shorter than the recovery time of the noise transients 332 and noise is sampled.

SUMMARY OF THE INVENTION

The present invention is an improved system for reducing noise coupling between the digital and analog portions of a mixed-signal IC. According to one aspect of the invention, the digital clock is gated to form a "quiet period" for analog sampling to take place.

According to another aspect of the invention, a digital clock provides a high-frequency system clock signal and a lower frequency analog clock signal provided by an analog clock signal generator. Analog sampling is triggered by a sampling edge of the analog clock signal. A gating signal generator also receives the digital and analog clock signals and generates a gating pulse having a leading edge occurring prior to the sampling edge and a trailing edge occurring subsequent to the sampling edge. A gating circuit receives the gating pulse and digital clock signal to generate a gated digital clock signal having no pulses when the gating pulse is received to provide a "quiet time" for analog sampling.

According to another aspect of the invention, the width of the gating pulse can be adjusted to compensate for noise transient having long recovery times.

Other features and advantages of the invention will become apparent in view of the following detailed description and appended drawings.

DESCRIPTION OF THE PREFERRED EMBODIMENT

Figure 1:
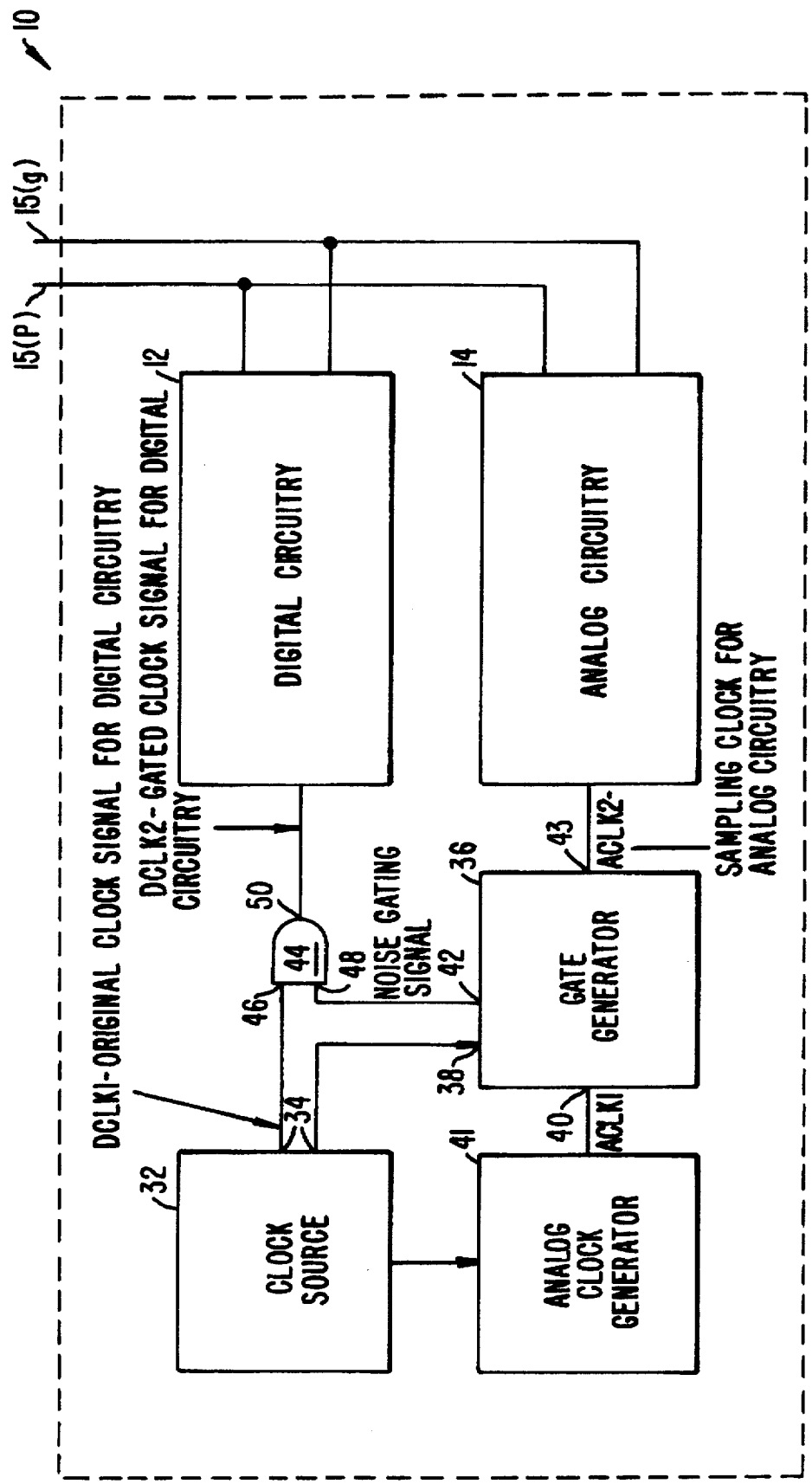
FIG. 1 is a block diagram of a preferred embodiment of the invention.

FIG. 1 is a block diagram of a preferred embodiment of the invention. Referring to FIG. 1, a monolithic integrated circuit (IC) 10 includes a digital circuitry portion 12 and an analog circuitry portion 14.

The analog portion 14 includes an analog sampling circuit (not shown) that samples an analog input signal when triggered by an analog clock signal. A system clock generator 32 has a system clock output 34 for providing a system clock signal (DCLK1). Power and ground terminals 15(p) and 15(g) are coupled to an external power supply (not shown).

A gating signal generating circuit 36 has inputs 38 and 40 coupled to system clock generator 32, to receive the system clock signal, and to an analog clock signal generator 37, to receive a first analog clock signal (ACLK1), and has outputs 42 and 43 for providing a clock gating signal (CLGS) and a second analog clock signal (ACLK2). A gating circuit 44 has inputs 46 and 48 coupled to the system clock generator 32, to receive the system clock signal, and to the gating signal generator 36, to receive the clock gating signal, and has an output 50 for providing a gated clock signal (DCLK2) to the digital portion 12.

The operation of the system depicted in FIG. 1 will now be described with reference the timing diagrams of FIG. 2.

The system clock signal DCLK1 100 comprises a series of pulses 102 which repeat at a high-frequency (f1) of up to several hundred MHz. Each pulse has a leading edge and a trailing edge.

Figure 2:
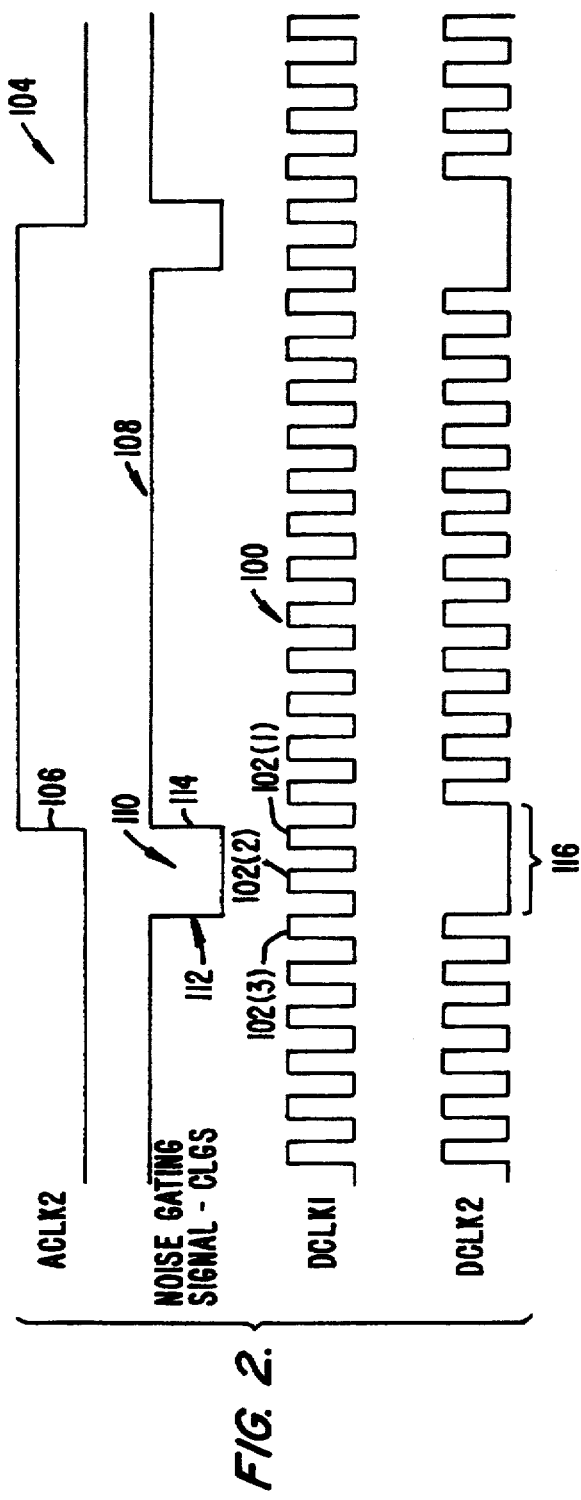
FIG. 2 is a timing diagram illustrating the operation of the embodiment depicted in FIG. 1.

As depicted in FIG. 2, the frequency (f2) of the analog sampling signal ACLK2 104 is much lower than f1. In the example, each pulse of ACLK2 104 has the same time duration as fourteen pulses of DCLK1. The analog sampling circuit 14 samples an analog input signal on an analog sampling edge 106 which, in this example, is the leading edge of each pulse of ACLK2 104.

The gating signal generator circuit 36 receives DCLK1 and ACLK1 and derives the clock gating signal CLGS 108 and ACLK2 104 therefrom. Note that each gating pulse 110 has a leading edge 112 which occurs before the analog sampling edge 106 and a trailing edge 114 which occurs after the analog sampling edge 106.

In the example of FIG. 2, the analog sampling edge of ACLK2 coincides with the trailing edge of a first DCLK1 pulse 102(1), which is preceded by second and third DCLK1 pulses 102(2) and 102(3), the leading edge 112 of the gating pulse 110 coincides with the trailing edge of the third DCLK1 pulse 102(3) that precedes the first DCLK1 pulse 102(1) by two pulses, and the gating pulse has a trailing edge 114 that coincides with the trailing edge of the first DCLK1 pulse 102(1) and the sampling edge 106.

The gating circuit 44 is an AND gate that receives DCLK1 100 and CLGS 108 at its inputs 46 and 48 and generates the gated digital clock signal DCLK2 120 at its output 50. Note that in DCLK2 the signal has a zero value for the duration of the CLGS pulses 110 and, in particular, the first and second DCLK1 pulses 102(1) and 102(2) have been blocked by the gating pulse 110 to form a "quiet period" 116.

Figure 3:
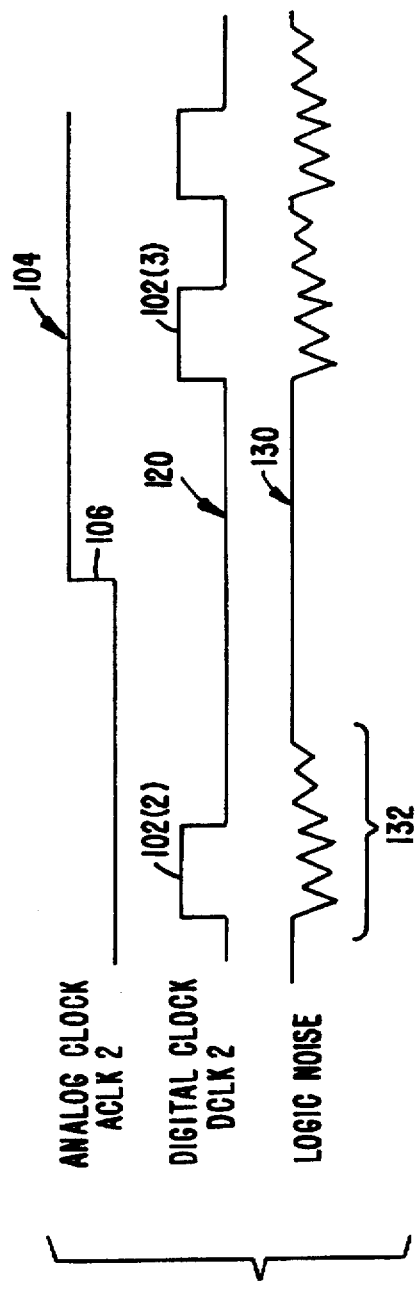
FIG. 3 is a timing diagram illustrating the operational advantages of the preferred embodiment.

In FIG. 3 the ACLK2 104 and DCLK2 120 are depicted on an expanded time scale. A logic noise signal 130 is also depicted.

As described above, noise transients 132 are caused at each pulse by switching transients of the logic gates. These noise transients have a recovery time which is expanded due to analog circuits which are excited by the switching transients. Note that the width of the gating pulse is greater than the recovery time of the analog circuits so that noise transients are not sampled at the sampling edge of an ACLK2 pulse.

As f1 increases the time between DCLK1 pulses decreases, so it could be necessary for a gating pulse to block out more than two DCLK1 pulses to provide for the recovery time of the analog circuit. The gating signal generating circuit would then be modified to generate an appropriate gating signal pulse.

Figures 4, 5:
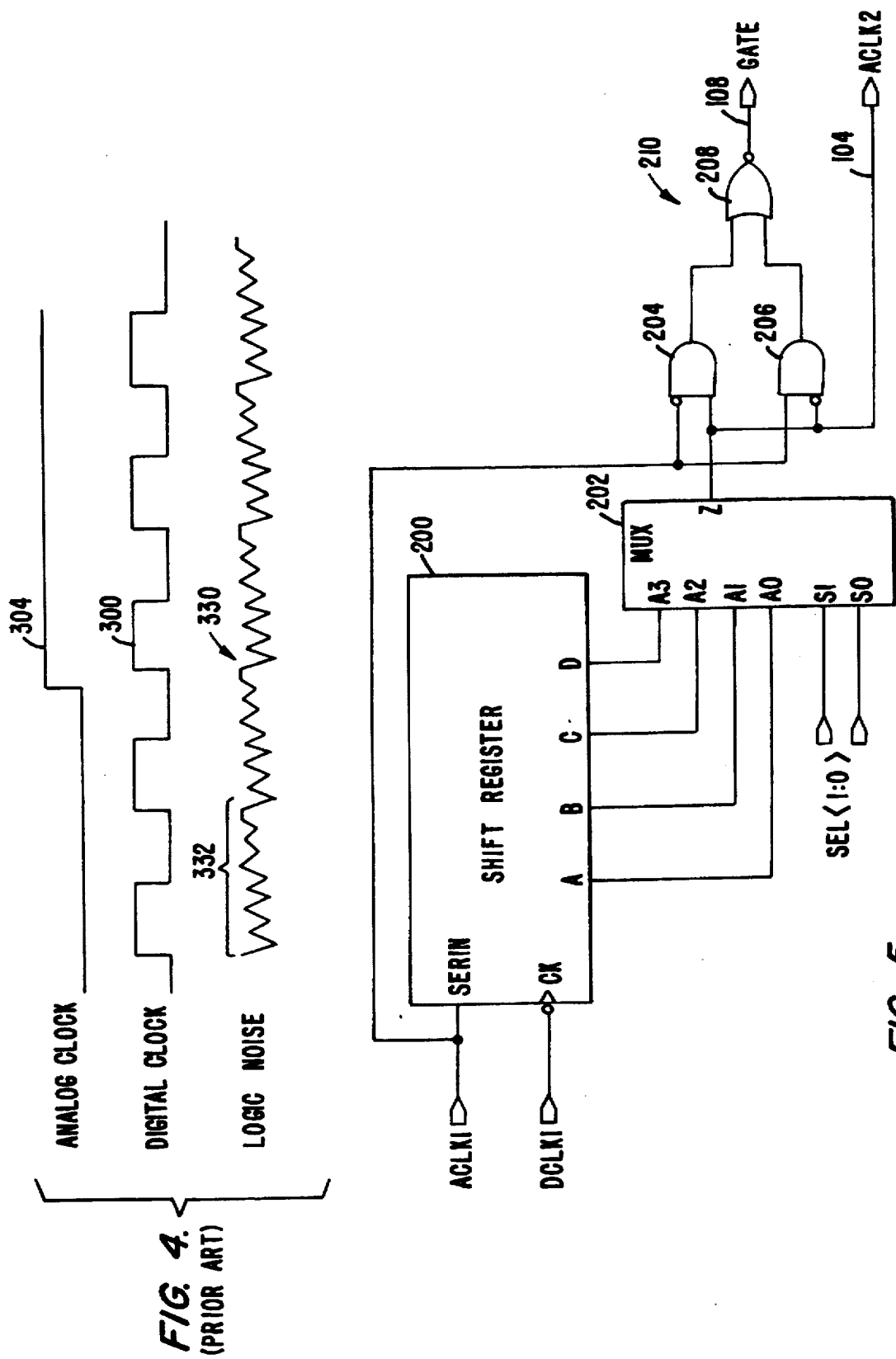
FIG. 4 is a timing diagram illustrating the problems of the prior art.
FIG. 5 is a schematic diagram of a gate signal generator.

FIG. 5 is a schematic diagram of a programmable gating circuit 36 that could be used to generate the CLGS 108 and ACLK2 signals. In FIG. 5, a shift register 200 has a SERIN input coupled to receive ACLK1, a clock (CK) input coupled to receive DCLK1, and has its A, B, C, and D outputs coupled, respectively, to the A0, A1, A2, and A3 inputs of a MUX 202. A SEL<1:0> signal is coupled to the control inputs S1 and S0 of the MUX 202. The output port Z of the MUX 202 is coupled to the positive input of a first AND gate 204 and to the negative input of a second AND gate 206. Additionally, the ACLK1 signal is coupled to the negative input of the first AND gate 204 and to the positive input of the second AND gate 206. The outputs of the first and second AND gates 204 and 206 are coupled to the inputs of a NOR gate 208. The first and second AND gates 204 and 206 and NOR gate 208 form a gating circuit 210. The output of the NOR gate 208 is the CLGS signal 108 and the output of the MUX is the ACLK2 signal 104.

Figure 6A:
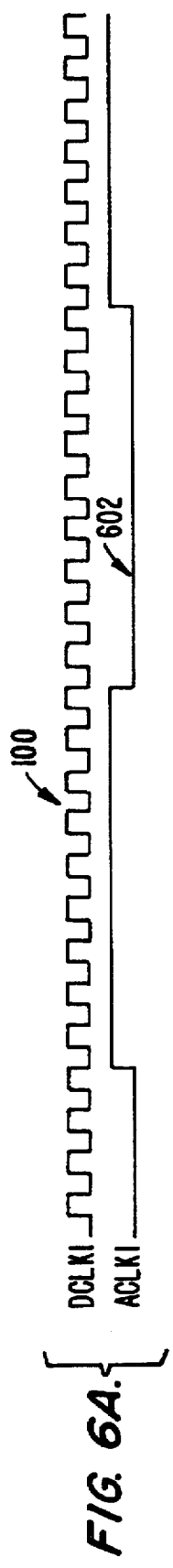
FIGS. 6A–6C are timing diagrams illustrating the operation of the gate signal generator.
Figure 6B:
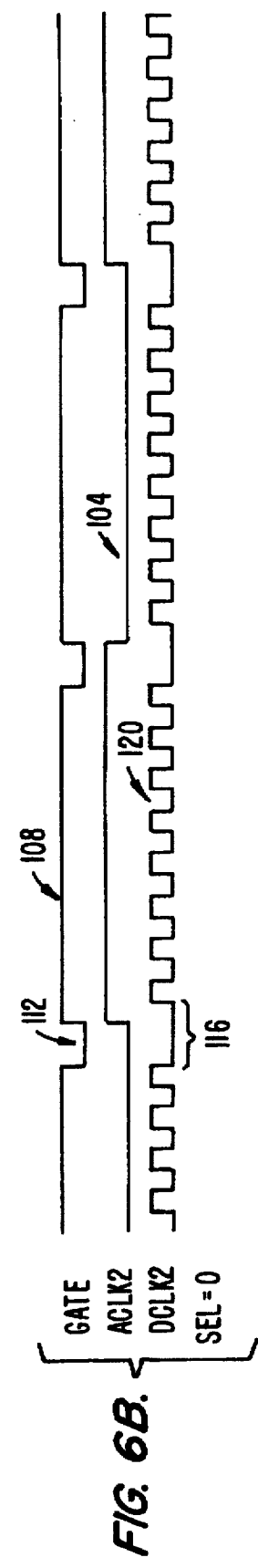
Figure 6C:
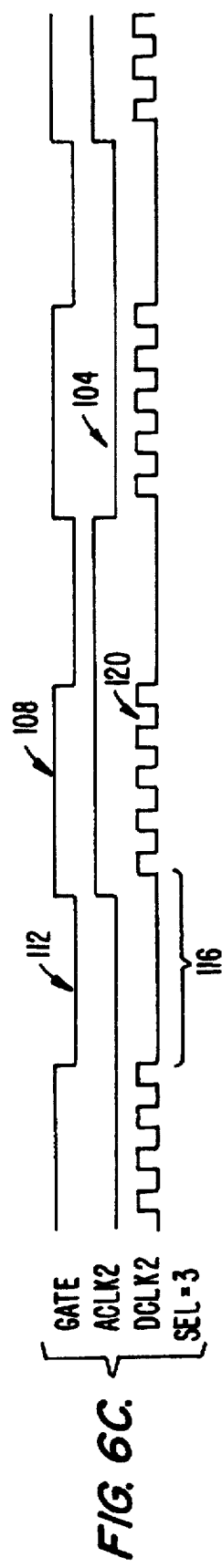

The operation of the gate signal generator 36 will now be described with reference to FIGS. 6A–6C. The DCLK1 100 and ACLK1 602 signals are depicted in FIG. 6A. In this example, each ACLK1 pulse is the same length as nine DCLK1 pulses. The ACLK1 and ACLK2 signals are processed by the gating circuit 210 to form gating pulses having a leading edge coincident with the leading edge of the ACLK1 pulses and a trailing edge coincident with leading edge of the ACLK2 pulses. The width of the gating pulse is equal to one DCLK1 pulse.

Note that the gated system clock, DCLK2, has "quiet period" 116 beginning one pulse before the sampling edge of ACLK2 and extending past the sampling edge.

The SEL<0:1> signal may have integral values between 0 and 3. The CLGS 108, DCLK2 120, and ACLK2 104 signals when SEL<1:0>=0 are depicted in FIG. 6B and when SEL<1:0>=3 are depicted in FIG. 6B.

When SEL=0 (FIG. 6B) the A output of the shift register 200 is coupled to the output Z of the MUX 202. Accordingly, the leading edge of ACLK1 is output at Z after a delay of one DCLK1 pulse and the delayed ACLK1 signal is provided as ACLK2. The width of the gating pulse 108 is one DCLK1 pulse.

When SEL=3 (FIG. 6C) the D output of the shift register 200 is coupled to the output Z of the MUX 202. Accordingly, the leading edge of ACLK1 is output at Z after a delay of three DCLK1 pulses and the delayed ACLK1 signal is provided as ACLK2. The width of the gating pulse 108 is three DCLK1 pulses.

Thus, the width of the gating pulse and the length of the "quiet period" is programmable by changing the value of SEL.

The invention has now been described with reference to the preferred embodiments. Alternatives and substitutions will now be apparent to persons of skill in the art. For example, the gate generator circuit can be realized by other combinations of digital logic such a counters and comparators. Accordingly, it is not intended to limit the invention except as provided by the appended claims.

What is claimed is:

1. In a mixed-signal sampled-data circuit including digital and analog portions formed on a common monolithic substrate, an improved system for reducing noise coupling from the digital portion to analog sampled data circuits, which sample an analog input signal at the sampling edges of an analog clock signal, included in the analog portion, said system comprising:

a digital clock generating circuit for generating a digital clock signal, with the digital clock signal comprising pulses repeating at a first frequency;

an analog clock signal generating circuit for generating the analog clock signal, with the analog clock signal comprising pulses repeated at a second frequency substantially lower than said first frequency, with each pulse having a leading edge and a trailing edge, with one of said edges functioning as a sampling edge;

a clock gating signal generating circuit, coupled to said digital clock signal generating circuit and coupled to said analog clock signal, for generating a series of gating pulses corresponding to the pulses of said analog clock signal, each gating pulse having a leading edge occurring before the sampling edge of a corresponding pulse in the analog clock signal; and a clock gating circuit, having inputs coupled to said digital clock generating circuit and said clock gating circuit and an output coupled to the digital portion, for generating a gated digital clock signal comprising pulses repeating at said first frequency only when a gating pulse is not generated and comprising no pulses when a gating pulse is generated to eliminate switching in the digital portion prior to the sampling edge of a corresponding pulse in said analog clock signal so that a quiet period is generated prior a time when an analog signal is being sampled by said analog sampling circuit.

2. The system of claim 1 where said clock gating signal generating circuit comprises:

a first circuit for controllably adjusting a gating pulse width to be equal to a selectable number of pulses of said digital clock signal.

* * * * *